United States Patent [19]
Dettmann et al.

[11] Patent Number: 5,621,377
[45] Date of Patent: Apr. 15, 1997

[54] SENSOR ASSEMBLY FOR MEASURING CURRENT AS A FUNCTION OF MAGNETIC FIELD GRADIENT

[75] Inventors: Fritz Dettmann, Sinn-Edingen; Uwe Loreit, Wetzlar-Naubom, both of Germany

[73] Assignee: Lust Electronic-Systeme GmbH, Lahnau-Walgirmes, Germany

[21] Appl. No.: 541,823

[22] Filed: Oct. 10, 1995

Related U.S. Application Data

[63] Continuation of Ser. No. 178,575, Jan. 7, 1994, abandoned.

[30] Foreign Application Priority Data

Jan. 13, 1993 [DE] Germany ............................ 43 00 605.1

[51] Int. Cl.$^6$ ..................................................... H01L 43/00
[52] U.S. Cl. ......................................... 338/32 R; 324/252
[58] Field of Search ........................... 338/32 R; 324/252, 324/117 R, 207.21, 207.12

[56] References Cited

U.S. PATENT DOCUMENTS

| | | | |
|---|---|---|---|
| 3,820,089 | 6/1974 | Lama | 340/174 |
| 4,385,273 | 5/1983 | Lienhard et al. | 324/117 R |
| 4,464,625 | 8/1984 | Lienhard et al. | 324/117 R |
| 4,712,064 | 12/1987 | Eckardt et al. | 324/252 X |
| 5,049,809 | 9/1991 | Wakatsuki et al. | 338/32 R X |
| 5,227,721 | 7/1993 | Kataoka et al. | 324/248 |
| 5,247,278 | 9/1993 | Pant et al. | 338/32 R |

FOREIGN PATENT DOCUMENTS

| | | |
|---|---|---|
| 155220 | 5/1982 | German Dem. Rep. . |
| 275745 | 1/1990 | German Dem. Rep. . |
| 3131431 | 2/1983 | Germany . |
| 4212737 | 7/1993 | Germany . |

OTHER PUBLICATIONS

"Current Measurements Based on Thin-Film Magnetoresistive Sensor", Sensors and Actuators A, 37–38 (1993) Jun. pp. 461–465, Andrae et al.

"New Magnetoresistive Sensors: Engineering and Applications" Sensors and Actuators A27 (1991) May, Nos. 1–3, pp. 763–766, Rottmann et al.

"Stromsesnor Als Mikrosystem" 2087 Elecktronki c41 (1993) Oct., No. 20 Ruel et al.

Patent Abstracts of Japan, English language abstract for JP 59158575, published Aug. 1984, 1 page.

Sensors and Actuators; Proceedings of Eurosensors VI, Jun.–Aug., 1993, vol. 2, 2 pages.

(List continued on next page.)

*Primary Examiner*—Teresa J. Walberg
*Assistant Examiner*—Karl Easthom
*Attorney, Agent, or Firm*—Flynn, Thiel, Boutell & Tanis, P.C.

[57] ABSTRACT

To measure magnetic field gradients is difficult because sensor elements available for this have only a limited linearity range due to their sensitivity which is strongly dependent on the temperature and on auxiliary-field magnetic fields and furthermore this sensitivity has a significant sample dispersion. Whereas now the arrangement of a a Wheatstone bridge with magnetoresistive resistors is such that on the one hand two symmetrical areas are provided, in each area of which a resistor of a bridge branch is arranged, and that moveover all other building elements are also designed with a high degree of symmetry. With this a symmetrical temperature gradient is created in the sensor chip, which gradient does not influence the output signal of the bridge. A temperature-dependent zero-point drift does also not exist. The changeable resistor needed for trimming is as the single singular structural part directly arranged on the central axis and also does not interfere with the measurement. The arrangement is particularly suited for the potential-free measurement of the current intensities.

28 Claims, 2 Drawing Sheets

OTHER PUBLICATIONS

Current Measurements Based On Thin–Film Magnetoresistive Sensors; Sensors and Actuators A, 37–38 (1993), pp. 461–465, Andrae, Kuehn and Pertsch.

New Magnetoresistive Sensors; Engineering And Applications; Sensors and Actuators A27 (1991) May, Nos. 1–3, pages 763–766, Rottmann and Dettmann.

Les Capteurs Magnétiques; 2429 Electronique Radio Plans, (1990) May, No. 510, pp. 19–26.

A Monolithic Superminiature Magnetoresistive Sensor; 298 NEC Research & Development (1989) Apr., No. 93, pp. 11–15, Konno, Kataniwa, Takado, Inui, Takanasi, Sagara, et al.

Stromsensor Als Mikrosystem; 2087 Elektronik 42 (1993) Oct., No. 20, 3 pages, Ruehl and Walther.

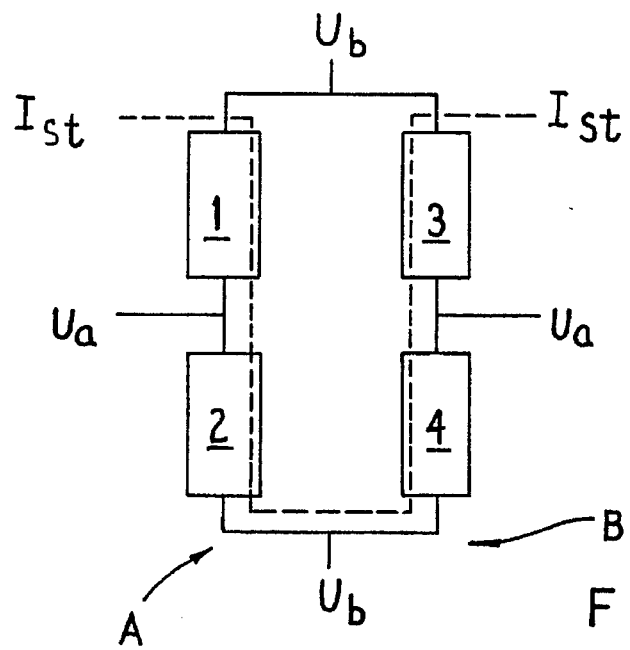
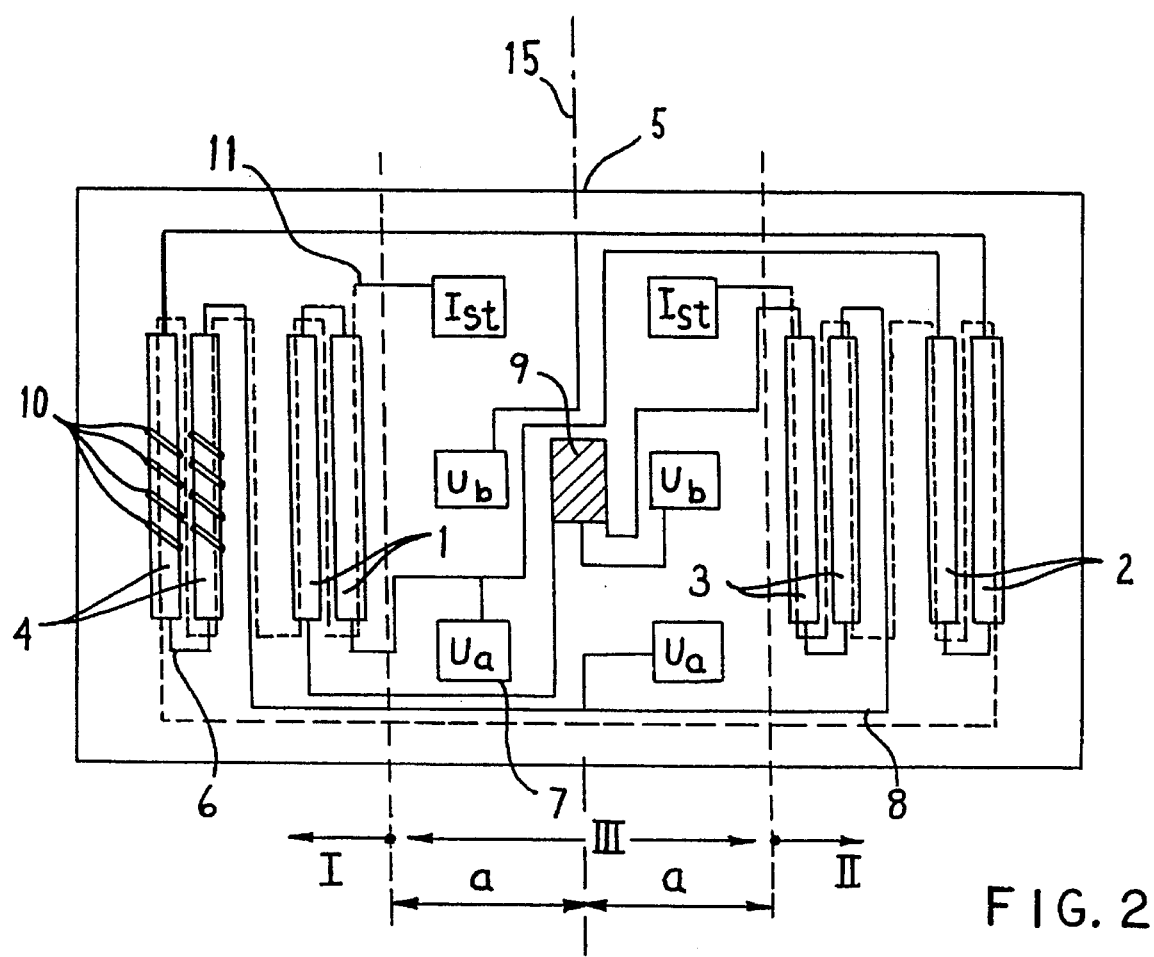

SENSOR ASSEMBLY FOR MEASURING CURRENT AS A FUNCTION OF MAGNETIC FIELD GRADIENT

This application is a continuation of U.S. Ser. No. 08/178,575, filed Jan. 7, 1994, now abandoned.

FIELD OF THE INVENTION

The invention relates to a sensor assembly, in particular for measuring current and voltage comprising a bridge circuit in the form of a Whetstone bridge for measuring the gradients of the intensity of a magnetic field and consisting of four magnetoresistive resistors arranged parallel to one another and in two areas at a distance from a center axis, of which two pairs of series connected resistors each form one bridge branch of the Whetstone bridge, and a sensor chip with such a bridge circuit and an arrangement for measuring an electric current with the help of such a sensor chip. Such a sensor chip is known from DE-C1 42 12 737.

BACKGROUND OF THE INVENTION

Measuring arrangements for determining magnetic-field gradients serve in particular a potential-free measurement of current intensity of an electric current which is the source of such a magnetic field. Since the entire surroundings of a magnetic field to be determined in this manner has always encountered stray electro-magnetic interference, it is obvious to differentiate, with the help of magnetic-field gradients, between the one to be measured and electro-magnetic interference.

Such arrangements are already known from DD Patent Nos. 155 220 and 275 745. Magnetoresistive sensor elements are thereby utilized since their sensitivity is sufficiently great in order to sense currents over a large measuring range. The linearity range of such sensor elements is, however, limited. Their actually high sensitivity depends much on the temperature and on an auxiliary magnetic field to be applied to the sensor elements. Moreover, the sensitivity of the individual sensor elements differs greatly.

The purpose of the invention is therefore to avoid these disadvantages and to provide a sensor chip of the type identified in greater detail above such that the output signal is proportional to an electric current to be measured, that its sensitivity depends neither on the temperature nor the auxiliary magnetic field and always has approximately the same sensitivity.

SUMMARY OF THE INVENTION

This purpose is attained according to the invention first by arranging the resistors of the areas symmetrically with respect to a central axis. The sensor chip is designed in a preferred manner such that it forms a highly accurate axis-symmetrical sensor chip.

The invention attains the purpose in a surprisingly simple manner. The output signal of the sensor chip has an unlimited linearity range and depends neither on the temperature nor on the auxiliary magnetic field. Sample dispersion is extremely low since the topography of the sensor chip can be manufactured very precisely with the help of microstructuring.

Since the distance between the two areas, that is, the base length of the gradiometer, can be kept small, the influence of the interference magnetic fields is insignificant since their sources are spaced a great distance from the measuring arrangement.

An arrangement with an inventive sensor chip has a high degree of geometric symmetry as a condition for a symmetric heating of the sensor chip during operation. Exempt from the symmetry is only the angle of the helically-wound structures on the magnetoresistive strip layers. The symmetric temperature increase caused by the operating current causes, in all strip layers of the Whetstone bridge, an equal rotation of the magnetization and thus an equal resistance change. With this the temperature-dependent zero-point drift in the sensor chip is also essentially eliminated, a feature beyond the actual purpose of the invention.

BRIEF DESCRIPTION OF THE DRAWINGS

The invention will be discussed in greater detail hereinafter in connection with one exemplary embodiment and the drawings, in which:

FIG. 1 shows a Wheatstone bridge according to the state of the art,

FIG. 2 shows a sensor chip according to the invention,

DETAILED DESCRIPTION

Figure 3:
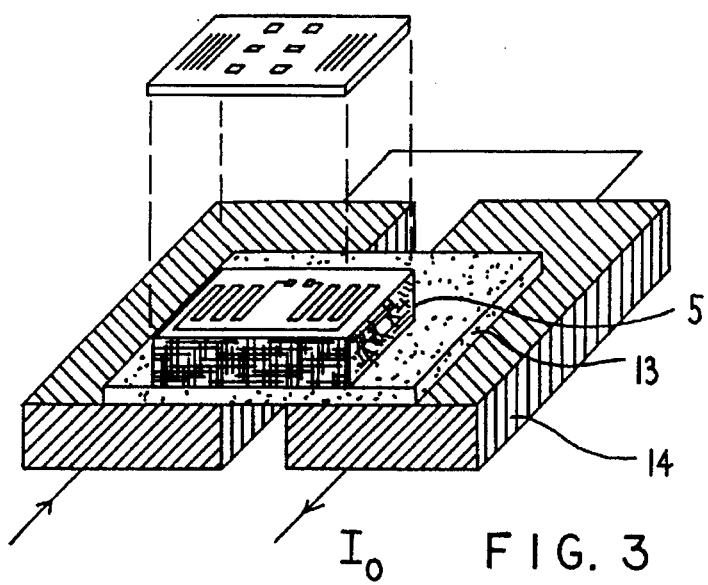
FIG. 3 shows the connection of a sensor chip of the invention to an electric circuit for measuring the magnitude of current flowing therein.

FIG. 1 shows a bridge circuit in the form of a Wheatstone bridge, in which two magnetoresistive resistors 1 and 2 are arranged and connected in series in a first bridge branch A and two further magnetoresistive resistors 3 and 4 are arranged and connected in series in a second bridge branch B. The Wheatstone bridge is supplied with an operating voltage $U_b$, the output voltage $U_a$ is used as its output signal. A thin-layer strip-line is provided under at least one of the resistors 1 to 4 and is insulated from the resistor; in order to provide identical structural parts, it is obvious to provide under each of the resistors 1 to 4 a thin-layer strip-line. Control current $I_{st}$ flows through the thin-layer strip-lines 11, shown best by reference to FIGS. 2 and 3.

The details of the sensor chip of the invention can be recognized in the illustration of FIG. 2. The sensor chip 5 includes two areas I and II each of which includes, starting at an equal distance α from a central axis 15, two magnetoresistive resistors 1; 4 and 2; 3. The resistors 1 to 4 each consists in turn of two strip layers, which are parallel with one another and with the others, and which have helically-wound structures 10. The helically-wound structures 10, which in FIG. 2 are only shown for the resistor 4, are the same for all resistors 1 to 4. Consequently, resistors 1 to 4 when exposed to a common magnetic field, undergo a common resistance change. Thus, care is taken that only one applied field gradient controls the bridge. The resistors 1 and 2 and the resistors 3 and 4 continue to exist on one and the same respective bridge branch A; B; whereas in the areas I and II each two resistors 1; 4 and 2; 3 from different bridge branches A; B are three-dimensionally combined. This becomes also clear from the illustrated electrical paths 6 between the layer strips and the circuits 8 leading from the layer strips to the outside. The paths 8 connect surface elements 7 to the layer strips. The surface elements 7 form, lying in one plane, externally accessible contacts on the sensor chip 5 for the operating voltage $U_b$ and the output voltage $U_a$. Two further surface elements 7 serve as externally accessible contacts for supplying the control current $I_{st}$. The surface elements 7 are arranged symmetrically with respect to the central axis 15 in the center area III of the sensor chip 5.

Furthermore a changeable resistor 9 is provided in the area of the central axis 15, which resistor 9 is, in the illustrated manner, connected in series with the branches of the Wheatstone bridge. The resistor 9 can be removed mechanically or by means of a laser, with this removal taking place such that the symmetry of the entire arrangement is maintained.

The output voltage $U_a$ is fed to an amplifier (not illustrated). Its output, the control current $I_{st}$, is applied through strip line 11 and is adjusted such that the action of the outer magnetic field gradient is cancelled at the location of the strip layers. The control current $I_{st}$ forms the output signal of the arrangement. It is directly proportional to the magnetic field gradient and is not influenced by temperature or by stray electro-magnetic interference. The inventive substantially axis symmetrical arrangement of the sensor chip 5 assures that the heat generated occurs symmetrically relative to the central axis 15. The resistance changes in the strip layers, which changes are caused by magnetostriction, are therefore the same all over and do not cause any change of the output voltage $U_a$. A zero-point drift in dependency of the temperature is thus essentially suppressed. Also the trimming of the bridge is done in an axis symmetrical manner since the resistor 9 is arranged on the central axis 15. The output voltage $U_a$ can in this manner be adjusted in the direction of zero when no magnetic field gradient exists.

Figure 4:
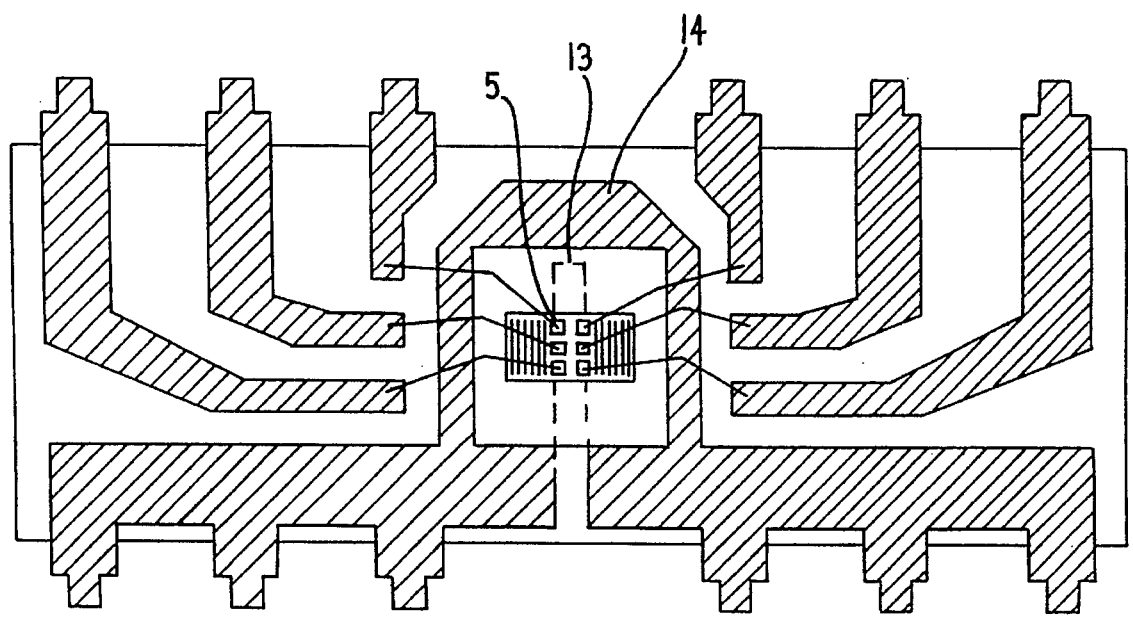
FIG. 4 shows the design of the connection contacts and of the power supply in an arrangement corresponding to FIG. 3.

FIGS. 3 and 4 show the use of a sensor chip 5 of the invention for measuring the current intensity of an electrical current $I_o$ flowing through two parallel, spaced apart circuit structures 14. The sensor chip 5 is electrically separated from the circuit structures 14 by insulation 13. Two circuit structures 14 are provided and through which the current $I_o$ flows in the manner shown in FIG. 3 that is the current $I_o$ flows in one direction through one of the conductive structures 14 and in the opposite direction through the adjacent conductive structure. Thus a magnetic field gradient is created as consequence of the current flowing in opposite directions through the conductive structures 14 that is proportional with the current $I_o$ in the circuit structure 14. Interference magnetic fields or stray electro-magnetic interference, which can be caused by other currents passing near-by, have no effect on the output signal, namely, the control current $I_{st}$, since its magnetic field acts equally on the two symmetrical areas I and II. What contributes to this is that the spaces between the areas I and II are smaller than 1 mm.

FIG. 4 shows a complete assemblies for the potential-free measurement of the current intensity $I_o$. Both circuit structures 14 are here formed such that again a magnetic field gradient is created at the location of the sensor chip 5. The insulation 13 between the sensor chip 5 and the circuit structures 14 and the arrangement of the building element pins for the current $I_o$ and for the supply to the sensor chip 5 on opposite sides of the building element provide a high protective insulation voltage.

The embodiments of the invention in which an exclusive property or privilege is claimed are defined as follows:

1. A sensor assembly for measuring current flow, said assembly including:

first and second spaced apart, parallel aligned conductive members for providing a conductive path for the current to be measured, said conductive members being symmetrically located around a sensor axis so as to have longitudinal axes parallel with said sensor axis and being connected together by an interconnect conductor so that the current will flow through said first conductive member in one direction and in said second conductive member in a second direction opposite said first direction;

first, second, third and fourth magnetoresistive resistors disposed over said first and second conductive members, each said resistor comprising at least one elongated structure with a longitudinal axis that is sensitive to magnetic fields that extend perpendicularly to said longitudinal axis, said first and fourth resistors being located side-by-side adjacent each other over said first conductive member, said second and third resistors being located side-by-side adjacent each other over said second conductive member, said first resistor being series connected between said second and third resistors, said second resistor being series connected between said first and fourth resistors, said fourth resistor being series connected between said second and third resistors, and said third resistor being series connected between said fourth and first resistors and all of said resistors being commonly aligned so that when said resistors are exposed to a common magnetic field, said resistors undergo a common change in resistance and said resistors being further arranged so that said first and third resistors are symmetrically located around said sensor axis and said second and fourth resistors are symmetrically located relative said sensor axis and said resistors are positioned so that said longitudinal axis thereof are parallel to said sensor axes;

a first pair of terminal elements, one of said first pair of terminal elements being connected between said first and third resistors and the other of said first pair terminal elements being connected between said second and fourth resistors; and a second pair of terminal elements, one of said second pair of terminal elements being connected between said first and second resistors and the other of said second pair terminal elements being connected between said third and fourth resistors.

2. The sensor assembly of claim 1 further including a strip line conductor located adjacent said resistors having a pattern that substantially follows an area subtended by said resistors.

3. The sensor assembly of claim 2, wherein said strip line conductor extends from an area subtended by said first resistor, to an area subtended by said fourth resistor, to an area subtended by said second resistor and to an area subtended by said third resistor.

4. The sensor assembly of claim 2, wherein said conductive strip is located between said conductive members and said resistors.

5. The sensor assembly of claim 2, wherein said resistors are located between said conductive members and said conductive strip.

6. The sensor assembly of claim 2, wherein said first and second conductive members are spaced apart a maximum distance of 1 mm.

7. The sensor assembly of claim 2, wherein each said resistor includes at least two parallel side-by-side elongated magnetoresistive structures that are series connected to each other.

8. The sensor assembly of claim 1, wherein said conductive member and said resistors are packaged together as a single unit.

9. A sensor assembly of claim 1, wherein each said resistor is formed with a helically wound structure, and wherein said helically wound structures have a common orientation.

10. The sensor assembly of claim 1, wherein said first and second conductive members are spaced apart a maximum distance of 1 mm.

11. The sensor assembly of claim 1, further including a trim resistor connected between said first and third resistors, said trim resistor being symmetrically positioned over said sensor axis.

12. The sensor assembly of claim 1, wherein each said resistor includes at least two parallel side-by-side elongated magnetoresistive structures that are series connected to each other.

13. A sensor assembly for measuring current flow, said assembly including:

a conductive structure having a U-shape with a pair of opposed, spaced apart legs through which the current flows through in opposite directions, said structure legs being spaced apart a maximum of 1 mm and being symmetrically located around a sensor axis;

an insulating layer disposed over said conductive structure;

a set of four magnetoresistive resistors located over said insulating layer, wherein a first and a fourth of said resistors are located over a first one of said conductive structure legs, wherein a second and a third of said resistors are located over the other of said conductive structure legs, said first and third resistors being symmetrically disposed around said sensor axis, said second and fourth resistors being symmetrically disposed around said sensor axis all of said resistors being commonly aligned so that when said resistors are exposed to a common magnetic field, said resistors undergo a common change in resistance and all of said resistors being connected together to form a Wheatstone bridge for measuring a magnetic field gradient that develops as a consequence of current flowing in opposite directions through said legs of said conductive structure;

a first pair of terminals attached to said Wheatstone bridge for applying a voltage to said Wheatstone bridge; and a second pair of terminals attached to said Wheatstone bridge for monitoring voltage changes across said Wheatstone bridge as a consequence of the development of the magnetic field gradient.

14. The sensor assembly of claim 13, wherein said resistors are elongate structures that have a longitudinal axes, are sensitive to magnetic fields that extend perpendicular to said longitudinal axes and are positioned over said legs of said conductive structure so that said resistor longitudinal axes are parallel with said conductive structure legs.

15. The sensor assembly of claim 14, wherein each said resistor includes at least two parallel side-by-side elongated magnetoresistive structures that are series connected to each other.

16. The sensor assembly of claim 13, wherein: said first resistor is series connected between said second and fourth resistors, said second resistor is series connected between said first and fourth resistors, said third resistor is series connected between said first and fourth resistors, and said fourth resistor is series connected between said second and third resistors.

17. The sensor assembly of claim 16, wherein said strip line conductor has a pattern that subtends areas subtended by said resistors.

18. The sensor assembly of claim 13, further including a strip line conductor located on a plane separate from a plane on which said resistors are located.

19. The sensor assembly of claim 18, wherein said strip line conductor is located between said conductive members and said resistors.

20. The sensor assembly of claim 13, wherein said conductive structure, said insulating layer and said magnetoresistive resistors are packaged together as a single unit.

21. The sensor assembly of claim 13, wherein each said resistor is formed with a helically wound structure, and wherein said resistors are arranged so that said helically wound structures have a common orientation.

22. A sensor assembly for measuring current flow, said assembly including:

first and second spaced apart, parallel aligned conductive members for providing a conductive path for the current to be measured, said conductive members being symmetrically located around a sensor axis so as to have longitudinal axes parallel with said sensor axis and being connected together by an interconnect conductor so that current will flow through said first conductive member in one direction and in said second conductive member in a second direction opposite said first direction; and a Wheatstone bridge disposed over said first and second conductive members, said Wheatstone bridge including: two parallel-connected bridge branches, each said bridge branch having first and second magnetoresistive resistors that are series connected together, each said resistor including at least one elongate structure with a longitudinal axis that is sensitive to magnetic fields that extend perpendicularly to said longitudinal axis, wherein said elongate structures forming said resistors are further commonly aligned so that when said resistors are exposed to a common magnetic field, said resistors undergo a common change in resistance; a first pair of terminals, said first pair of terminals being connected to opposed points where said bridge branches are connected together so as to allow a voltage to be applied across said Wheatstone bridge; and a second pair of terminals, said second pair of terminals being connected to separate first resistor-second resistor functions so that a Wheatstone bridge voltage can be measured across said second pair terminals wherein, said resistors are located over said first and second conductive members so that the opposed current flow through said conductive members causes opposite changes in the resistivity of said first resistors of said bridge branches, opposite changes in the resistivity of said second resistors of said bridge branches and opposite changes in the resistivity of said first and second resistors forming each said bridge branch.

23. The sensor assembly of claim 22, wherein said resistors forming a first bridge branch are located over separate said conductive members and are symmetrically located around said sensor axis and said resistors forming a second said bridge branch are located over separate said conductive members and are symmetrically located around said sensor axis.

24. The sensor assembly of claim 23, wherein: said first resistors of said bridge branches are connected together at one end of said Wheatstone bridge and said second resistors of said bridge branch are connected together at a second end of said Wheatstone bridge opposite said first end; and said first resistor of said first bridge branch and said second resistor of said second bridge branch are located over one said conductive member and said first resistor of said second bridge branch and said second resistor of said first bridge branch are located over the other said conductive member.

25. The sensor assembly of claim 22, wherein said first and second conductive members are spaced apart a maximum distance of 1 mm.

26. The sensor assembly of claim 22, wherein said assembly is housed in a single package.

27. The sensor assembly of claim 22, further including a conductive strip located between said Wheatstone bridge and said parallel aligned conductive members, said conductive strip being positioned to subtend an area subtended by said resistors forming said Wheatstone bridge.

28. A sensor assembly of claim 22, wherein each said resistor is formed with a helically wound structure, and wherein said resistors are arranged so that helically wound structures have a common orientation.

* * * * *

UNITED STATES PATENT AND TRADEMARK OFFICE
CERTIFICATE OF CORRECTION

PATENT NO. : 5 621 377
DATED : April 15, 1997
INVENTOR(S) : Fritz DETTMANN et al It is certified that error appears in the above-indentified patent and that said Letters Patent is hereby corrected as shown below:

Column 4, line 32; change "axis" to ---axes---.
Column 4, line 33; change "axes" to ---axis---.
Column 4, line 44; change "resistors having a pattern" to ---resistors and having a pattern---.
Column 5, line 32; change "axis all of" to ---axis, all of---.
Column 5, line 49; change "that have a longitudinal" to ---that have longitudinal---.
Column 6, line 44; change "functions" to ---junctions---.

Signed and Sealed this

Twenty-ninth Day of July, 1997

Attest:

BRUCE LEHMAN

Attesting Officer

Commissioner of Patents and Trademarks